United States Patent
Wang et al.

(10) Patent No.: US 9,590,564 B2
(45) Date of Patent: Mar. 7, 2017

(54) MULTIBAND POWER AMPLIFICATION APPARATUS

(71) Applicant: Huawei Technologies Co., Ltd., Shenzhen (CN)

(72) Inventors: Kun Wang, Shenzhen (CN); Di Wu, Shenzhen (CN); Erni Zhu, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/998,371

(22) Filed: Dec. 24, 2015

(65) Prior Publication Data

US 2016/0142022 A1   May 19, 2016

Related U.S. Application Data

(63) Continuation of application No. PCT/CN2013/078139, filed on Jun. 27, 2013.

(51) Int. Cl.
*H03F 3/68* (2006.01)
*H03F 1/02* (2006.01)
(Continued)

(52) U.S. Cl.
CPC ......... *H03F 1/0288* (2013.01); *H03F 1/3247* (2013.01); *H03F 1/3252* (2013.01);
(Continued)

(58) Field of Classification Search
USPC ............... 330/295, 124 R, 84, 286, 149, 126
See application file for complete search history.

(56) References Cited

U.S. PATENT DOCUMENTS

| | | | |
|---|---|---|---|
| 7,656,228 B2 * | 2/2010 | Fukuda | H03F 1/0288 330/126 |
| 7,961,045 B2 * | 6/2011 | Morris | H03F 1/0288 330/124 R |

(Continued)

FOREIGN PATENT DOCUMENTS

| | | |
|---|---|---|
| CN | 1893259 A | 1/2007 |
| CN | 101093978 A | 12/2007 |

(Continued)

OTHER PUBLICATIONS

Chen, W. et al., "Design and Linearization of Concurrent Dual-Band Doherty Power Amplifier with Frequency-Dependent Power Ranges," IEEE Transactions on Microwave Theory and Techniques, vol. 59, No. 10, Oct. 2011, 10 pages.

*Primary Examiner* — Hieu Nguyen
(74) *Attorney, Agent, or Firm* — Slater Matsil, LLP

(57) ABSTRACT

The present application provides a multiband power amplification apparatus. The first input terminal receives a signal in a frequency band $f_1$; the second input terminal receives a signal in a frequency band $f_2$. The first adjustment module adjusts a first channel of signal and then outputs an adjusted first channel of signal to the first adder. The second adjustment module adjusts a third channel of signal and then outputs an adjusted third channel of signal to the first adder. The first adder converges the signal adjusted by the second adjustment module and the signal output by the first adjustment module and then outputs a converged signal to a first digital-to-analog converter. The second adder converges a second channel of signal and a fourth channel of signal and then outputs a converged signal to a second digital-to-analog converter.

6 Claims, 11 Drawing Sheets

(51) Int. Cl.
  *H03F 3/19*   (2006.01)
  *H03F 1/26*   (2006.01)
  *H03F 1/32*   (2006.01)
  *H03F 3/189*  (2006.01)
  *H03F 3/24*   (2006.01)

(52) U.S. Cl.
  CPC .............. *H03F 3/189* (2013.01); *H03F 3/19* (2013.01); *H03F 3/245* (2013.01); *H03F 2200/111* (2013.01); *H03F 2200/165* (2013.01); *H03F 2200/451* (2013.01)

(56) References Cited

U.S. PATENT DOCUMENTS

| | | |
|---|---|---|
| 2007/0008032 A1 | 1/2007 | Kyu et al. |
| 2008/0007331 A1 | 1/2008 | Suzuki et al. |
| 2008/0238544 A1 | 10/2008 | Morris et al. |

FOREIGN PATENT DOCUMENTS

| | | |
|---|---|---|
| CN | 102801387 A   | 11/2012 |
| CN | 102868368 A   | 1/2013 |
| CN | 2013056632 A1 | 4/2013 |
| EP | 2442441 A2    | 4/2012 |

\* cited by examiner

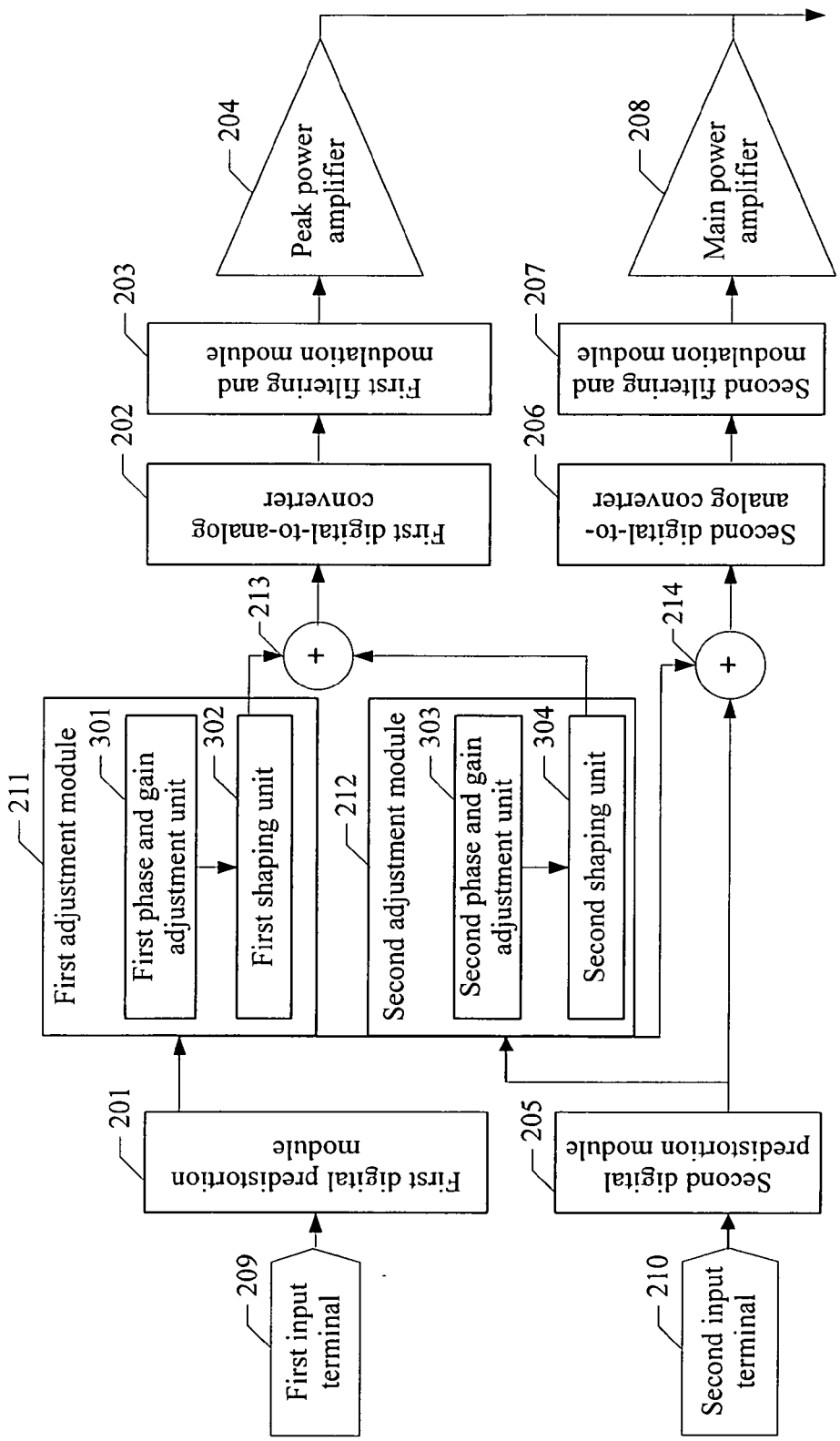
FIG. 3-a

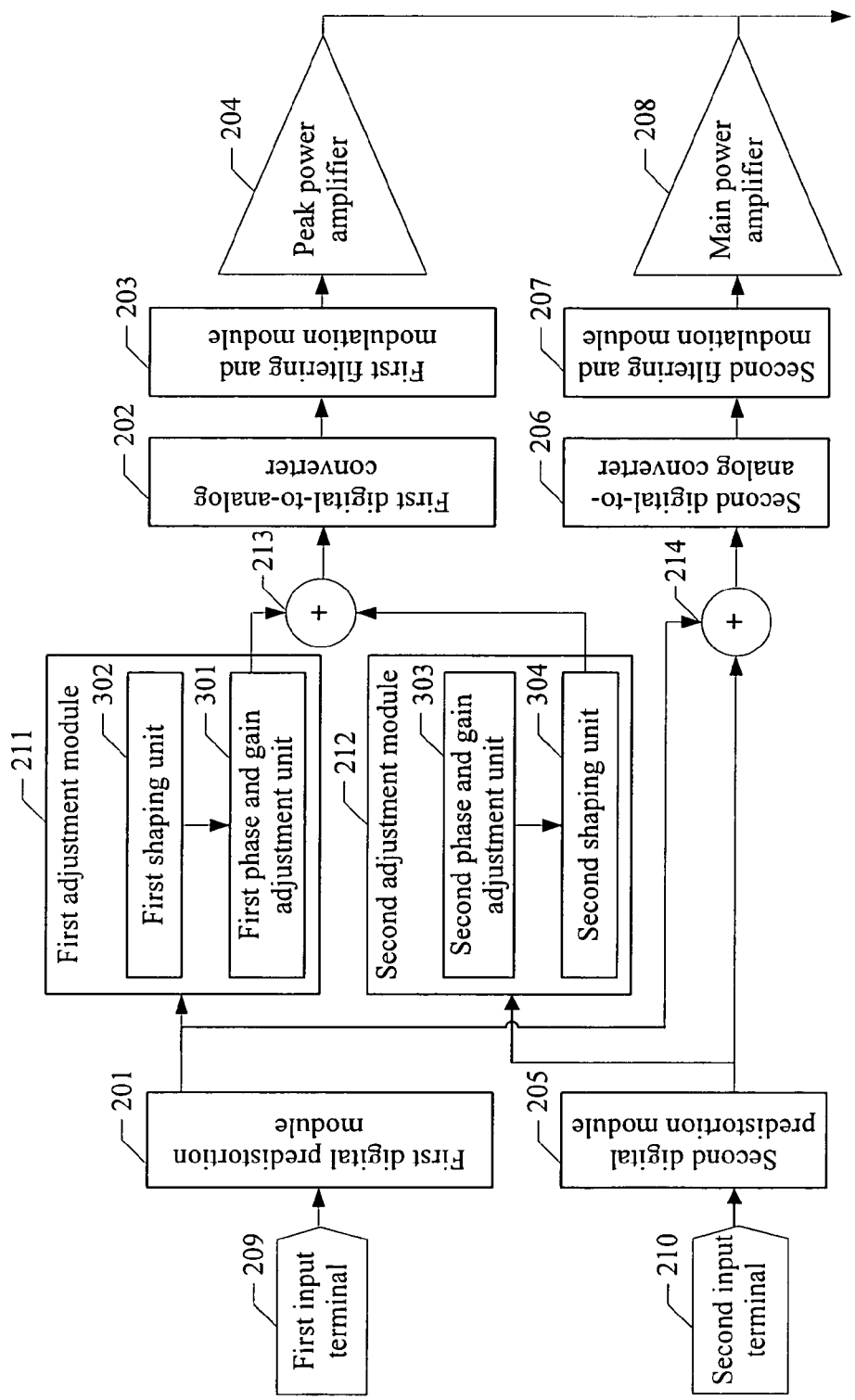
FIG. 3-b

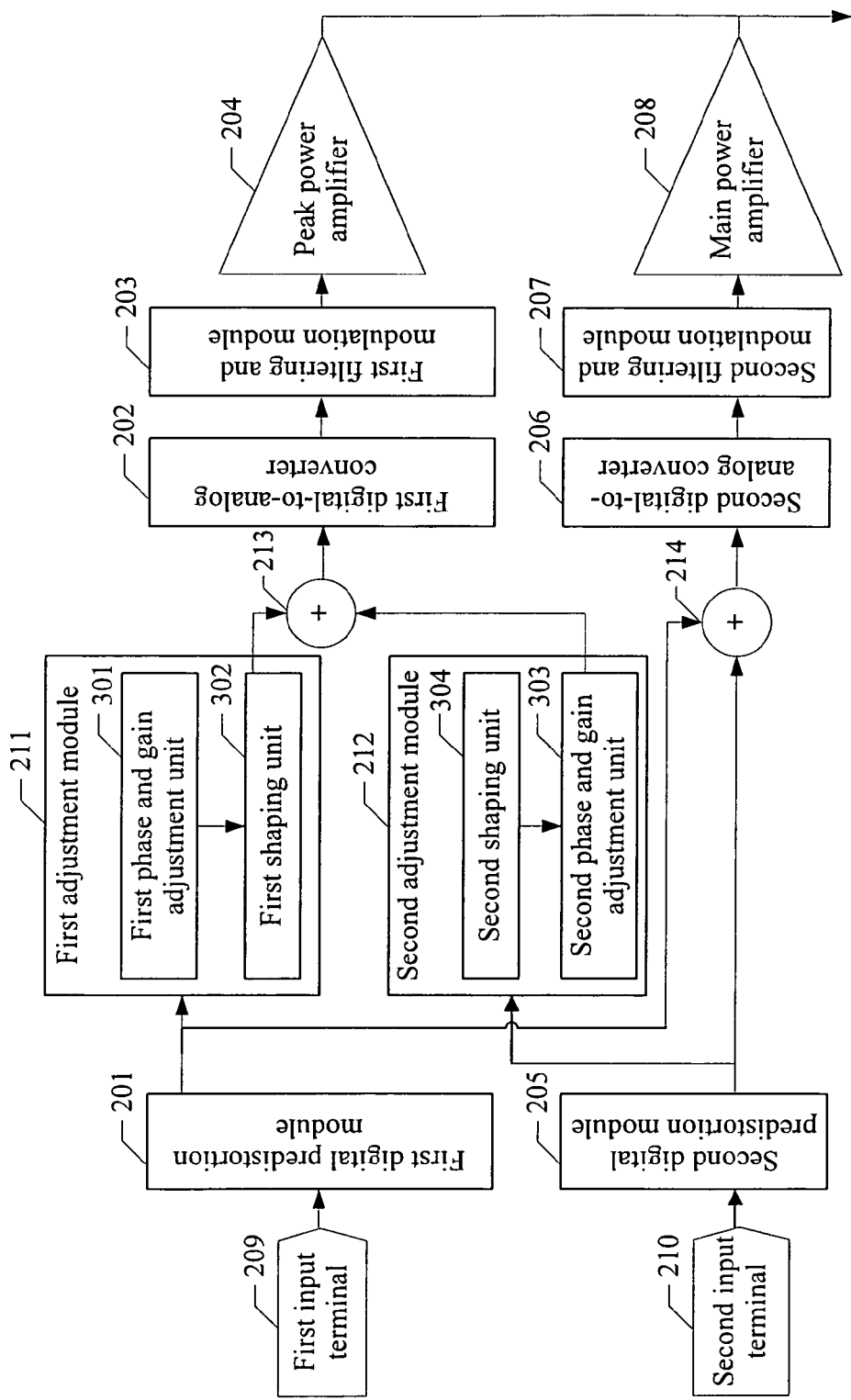
FIG. 3-c

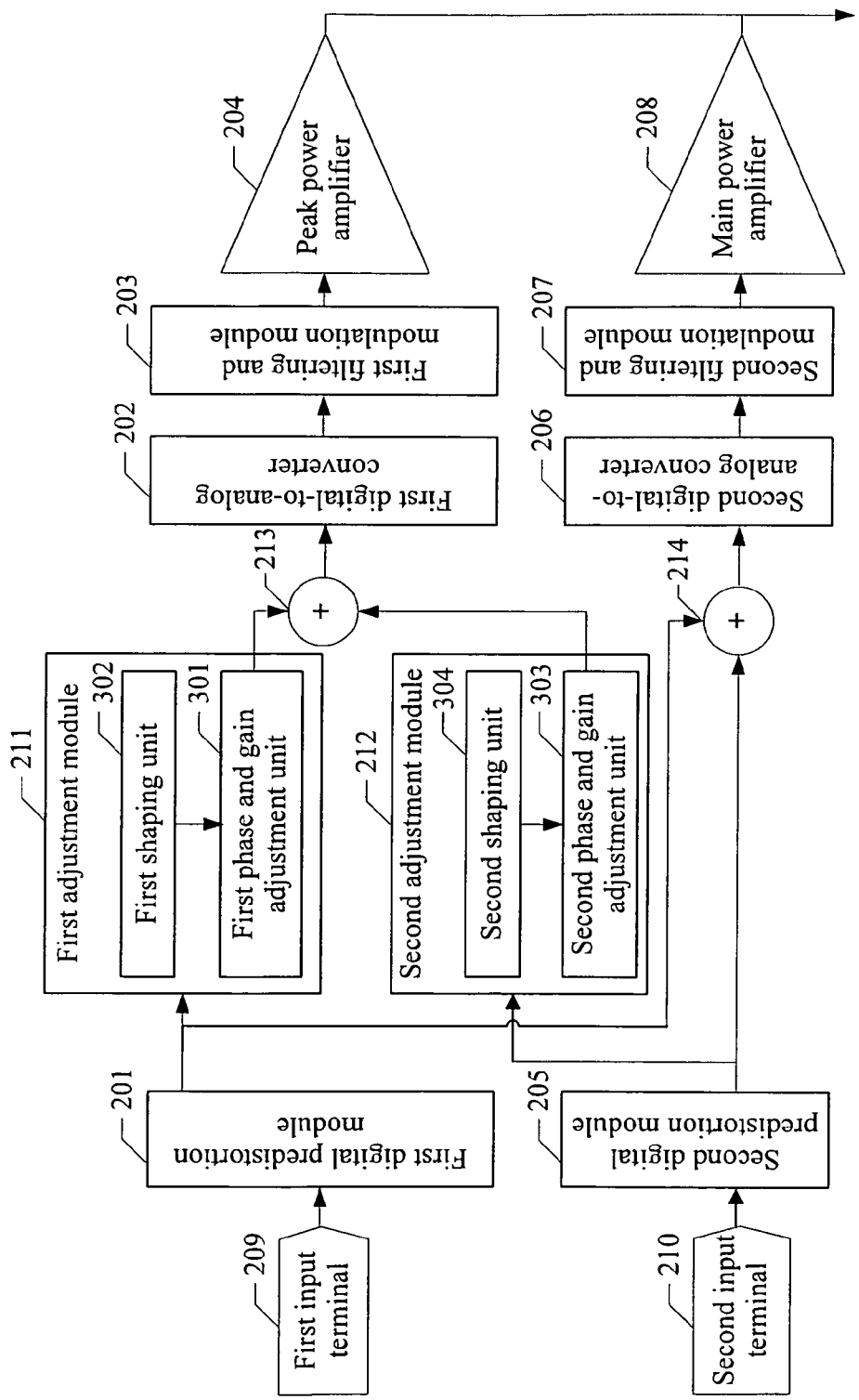
FIG. 3-d

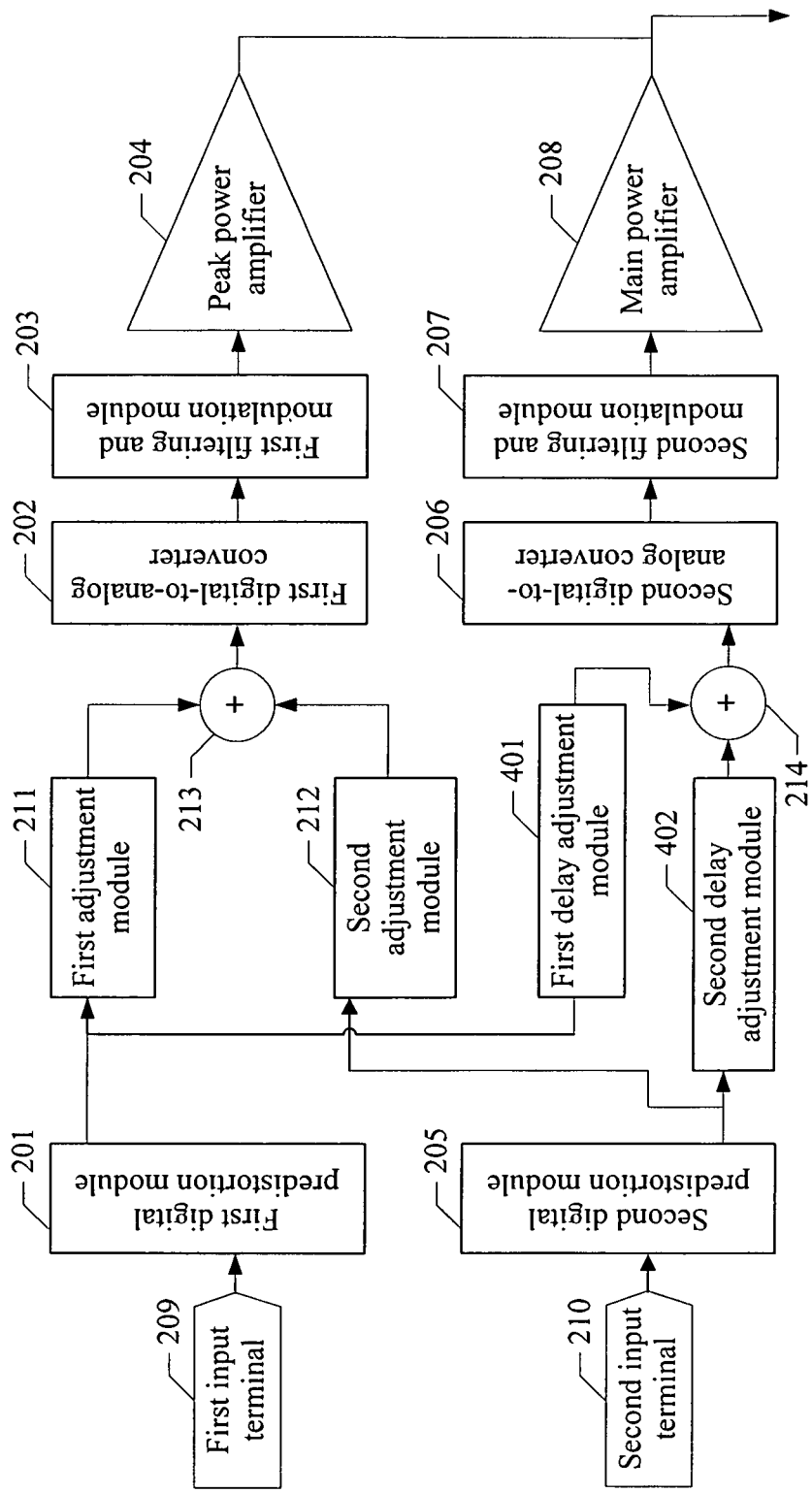
FIG. 4-a

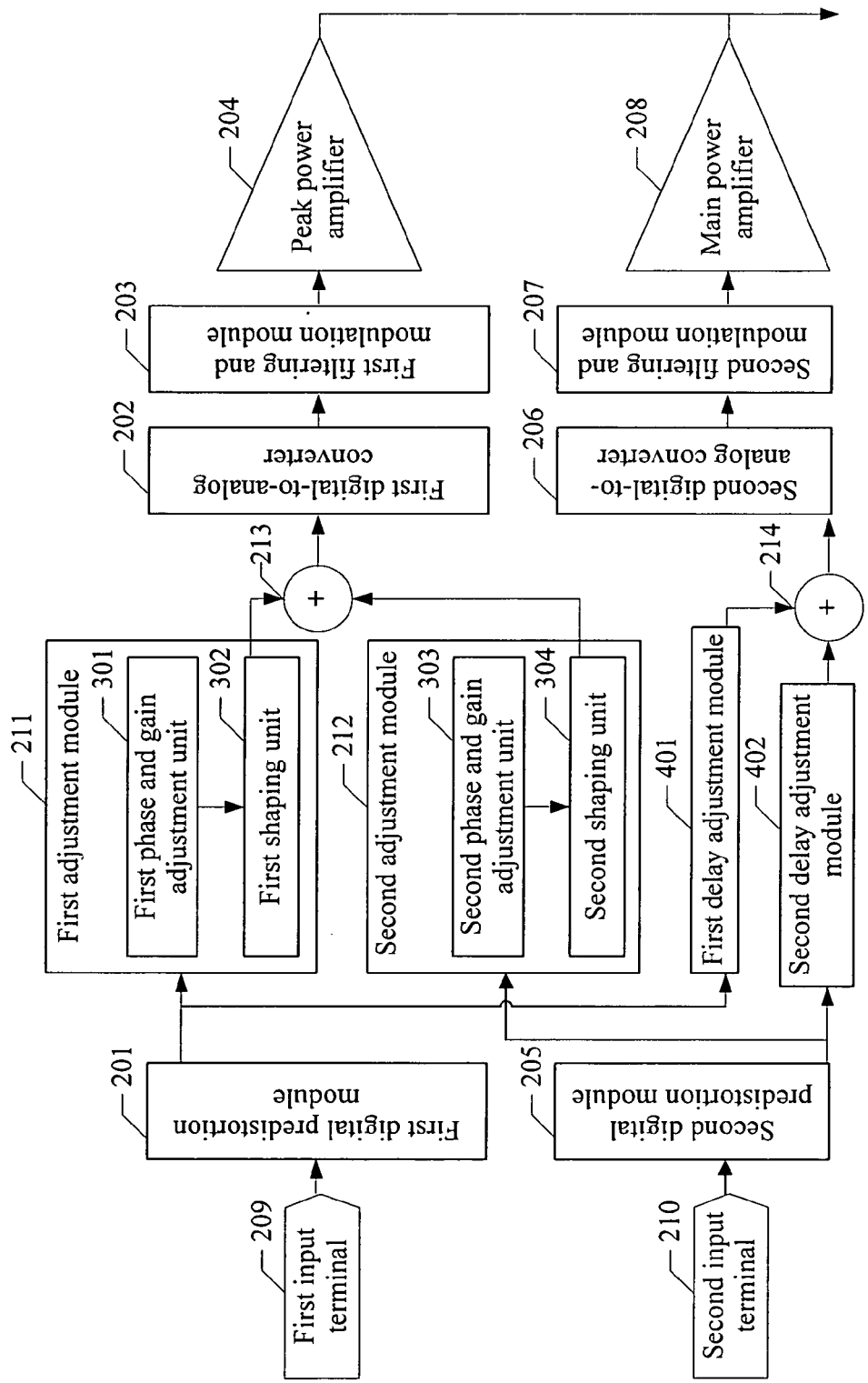
FIG. 4-b

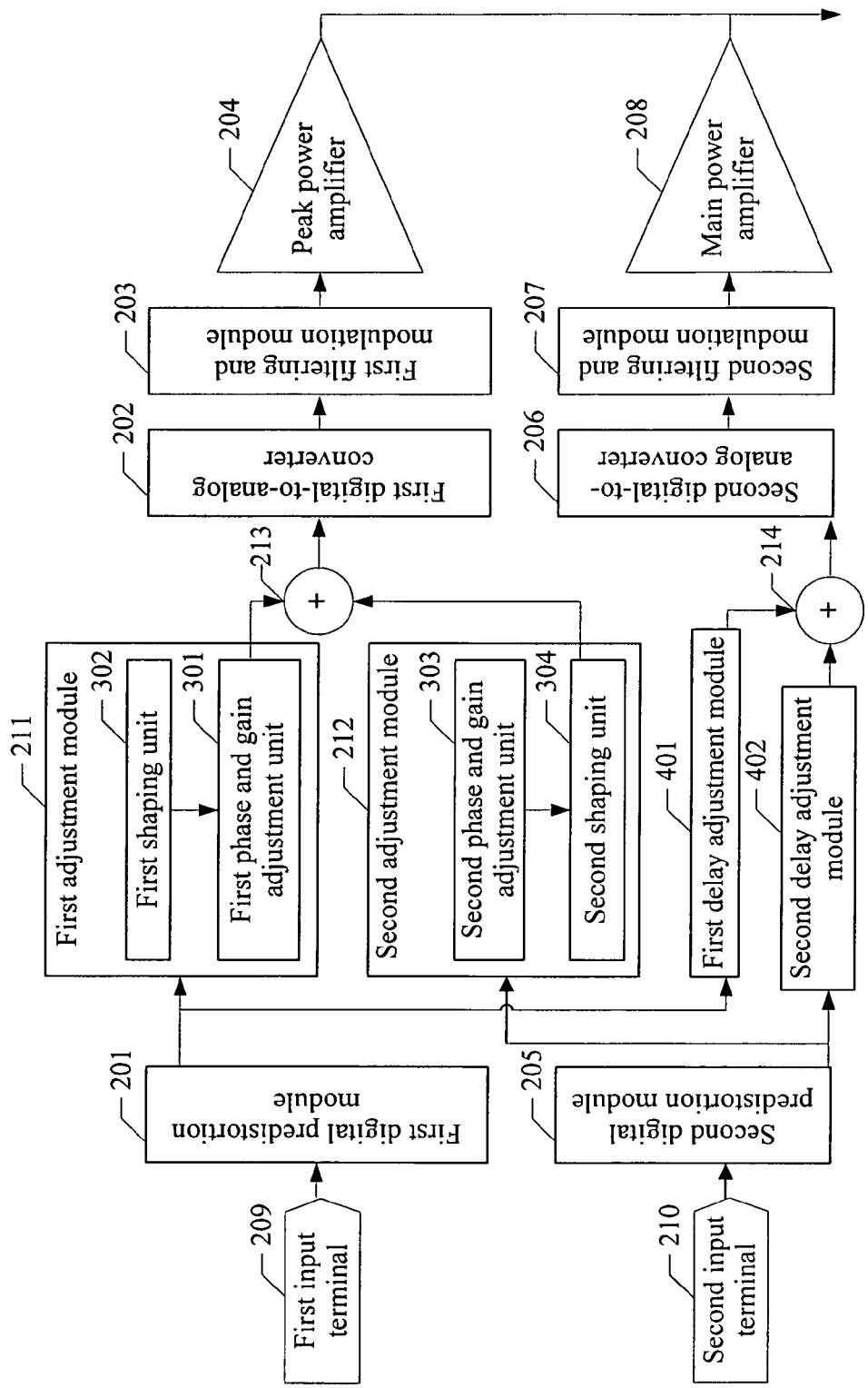
FIG. 4-c

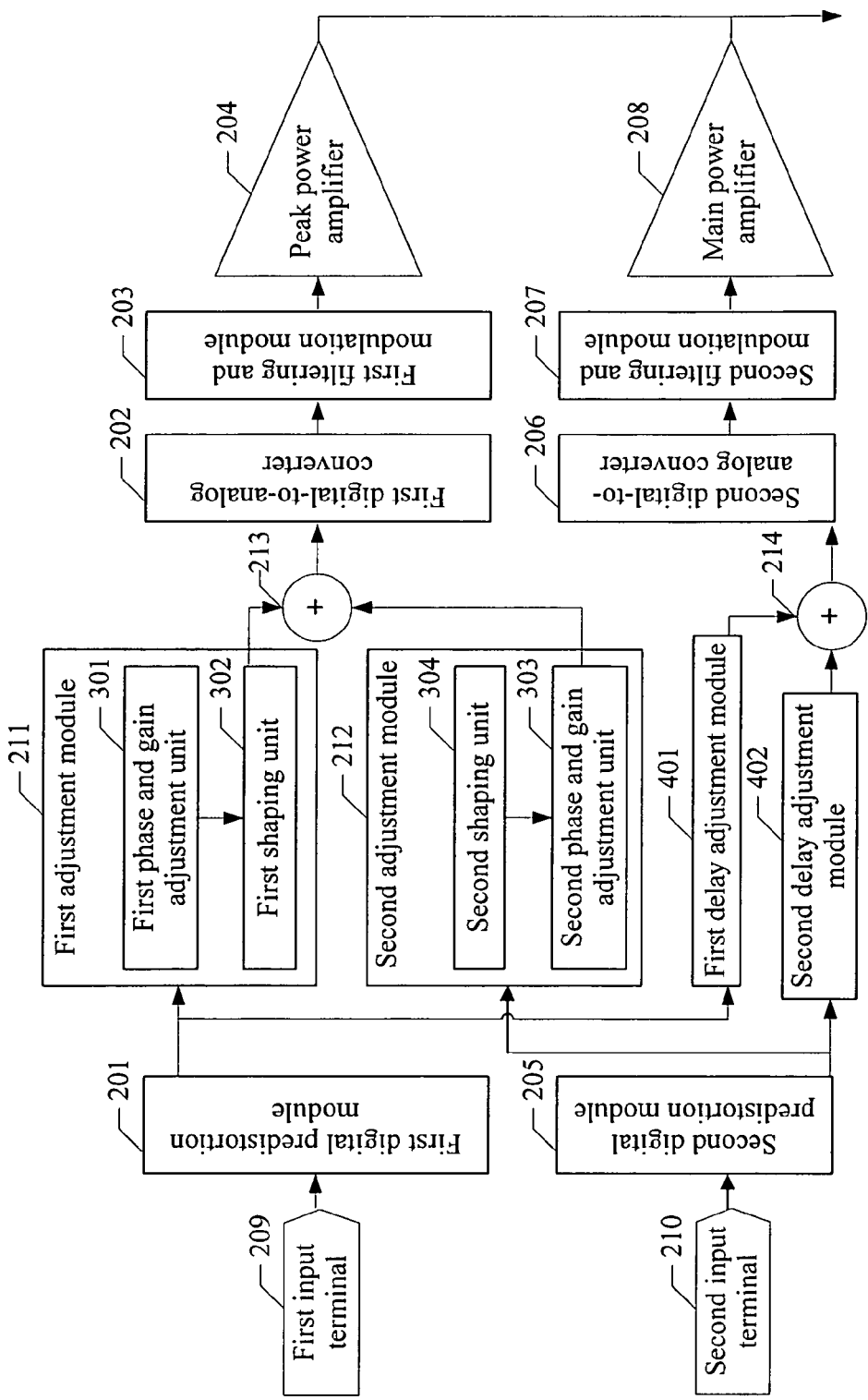
FIG. 4-d

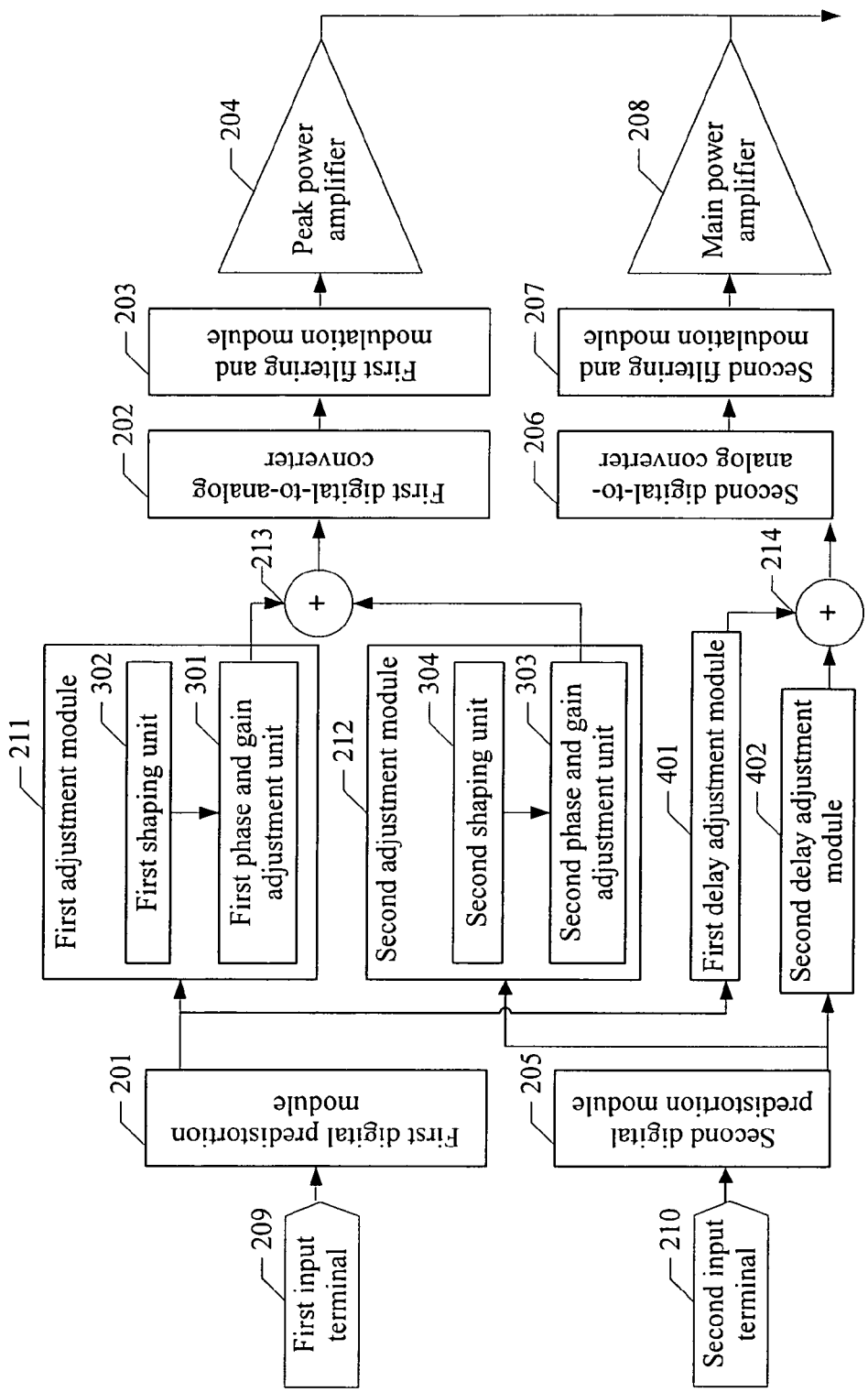
FIG. 4-e

MULTIBAND POWER AMPLIFICATION APPARATUS

This application is a continuation of International Application No. PCT/CN2013/078139, filed on Jun. 27, 2013, which is hereby incorporated by reference in its entirety.

TECHNICAL FIELD

The present application relates to the mobile communications field, and in particular, to a multiband power amplification apparatus.

BACKGROUND

In a wireless communications system, a power amplifier is disposed at a front end of a transmitter, where a main function of the power amplifier is to implement amplification of a signal and meet a power requirement of sending a signal by the system. To ensure modulation precision and cause no interference with another system, a relatively high requirement is raised for a linearity technology of the power amplifier. Although the power amplifier and a related technology have always been a research focus in the communications field, requirements for the power amplifier are still centering around two aspects: efficiency and linearity, which mainly relate to various architectures of the power amplifier, various technologies of the power amplifier, and various algorithms that are of the linearity technologies and corresponding to the power amplifier. For example, a Doherty technology gains a great success in a practical application of the power amplifier. By using this technology, high efficiency can be provided, and a requirement of the system can be met by improving linearity by using a digital predistortion technology.

In an existing dual-input Doherty architecture that is based on and derived from a Doherty power amplifier, as shown in FIG. 1, a signal occupying a frequency band is divided into two channels of signals after being input from an input end, one channel of signal passes through a digital predistortion module, a digital-to-analog converter, and a peak power amplifier, the other channel of signal passes through a digital predistortion module, a digital-to-analog converter, and a main power amplifier, the two channels of signals are converged after being output by the peak power amplifier and by the main power amplifier, and the two channels of signals are matched by a matching module and then are output to a load apparatus. By using the dual-input Doherty architecture, an input impedance matching of the Doherty power amplifier can be improved, precision that cannot be reached by commissioning an analog power amplifier can be provided in the digital field, and load pulling of the Doherty power amplifier can be achieved with a high-precision time delay and phase.

As communications technologies develop, technologies such as a multiband technology and an ultra wideband technology raise a higher requirement for a power amplifier. Consequently, there is a great difficulty in considering both the efficiency and the linearity in the power amplifier architecture shown in FIG. 1. For example, the power amplifier architecture shown in FIG. 1 may be capable of meeting a requirement of a signal A in a frequency band f for aspects of efficiency and linearity, but has difficulty in meeting a signal B in a frequency band f for aspects of efficiency and linearity, and vise versa. If the power amplifier architecture meets requirements of both the signal A and the signal B, efficiency is very low, which brings a great difficulty in a system design.

SUMMARY

Embodiments of the present application provide a multiband power amplification apparatus, so as to consider both efficiency improvement and a linearity requirement.

The embodiments of the present application provide a multiband power amplification apparatus, including a first digital predistortion module, a first digital-to-analog converter, a first filtering and modulation module, a peak power amplifier connected to the first filtering and modulation module, a second digital predistortion module, a second digital-to-analog converter, a second filtering and modulation module connected to the second digital-to-analog converter, and a main power amplifier connected to the second filtering and modulation module, where the apparatus further includes a first input terminal, a second input terminal, a first adjustment module, a second adjustment module, a first adder, and a second adder.

The first input terminal is connected to the first digital predistortion module and configured to receive a signal in a frequency band $f_1$ and then output the signal in the frequency band $f_1$ to the first digital predistortion module, where the first digital predistortion module divides the signal in the frequency band $f_1$ into a first channel of signal and a second channel of signal. The second input terminal is connected to the second digital predistortion module and configured to receive a signal in a frequency band $f_2$ and then output the signal in the frequency band $f_2$ to the second digital predistortion module, where the second digital predistortion module divides the signal in the frequency band $f_2$ into a third channel of signal and a fourth channel of signal.

The first adjustment module is connected to the first digital predistortion module and configured to adjust the first channel of signal that is divided by the first digital predistortion module and then output an adjusted first channel of signal to the first adder. The second adjustment module is connected to the second digital predistortion module and configured to adjust the third channel of signal that is divided by the second digital predistortion module and then output an adjusted third channel of signal to the first adder. The first adder is configured to converge the signal adjusted by the second adjustment module and the signal output by the first adjustment module and output a converged signal to the first digital-to-analog converter. The second adder is configured to converge the second channel of signal that is divided by the first digital predistortion module and the fourth channel of signal that is divided by the second digital predistortion module and output a converged signal to the second digital-to-analog converter.

Optionally, the first adjustment module includes a first phase and gain adjustment unit and a first shaping unit, and the second adjustment module includes a second phase and gain adjustment unit and a second shaping unit. The first phase and gain adjustment unit is configured to adjust a phase and a gain of the first channel of signal that is divided by the first digital predistortion module and then output an adjusted signal to the first shaping unit. The first shaping unit is configured to perform a waveform adjustment on the signal that is obtained after the first phase and gain adjustment unit adjusts the phase and the gain and then output a signal obtained after the waveform adjustment to the first adder. The second phase and gain adjustment unit is configured to adjust a phase and a gain of the third channel of signal that is divided by the second digital predistortion module and then output an adjusted signal to the second shaping unit. The second shaping unit is configured to perform a waveform adjustment on the signal that is obtained after the second phase and gain adjustment unit adjusts the phase and the gain and then output a signal obtained after the waveform adjustment to the first adder.

Optionally, the first adjustment module includes a first phase and gain adjustment unit and a first shaping unit, and the second adjustment module includes a second phase and gain adjustment unit and a second shaping unit. The first shaping unit is configured to perform a waveform adjustment on the first channel of signal that is divided by the first digital predistortion module and then output a signal obtained after the waveform adjustment to the first phase and gain adjustment unit. The first phase and gain adjustment unit is configured to adjust a phase and a gain of the signal that is obtained after the first shaping unit performs the waveform adjustment and then output an adjusted signal to the first adder. The second phase and gain adjustment unit is configured to adjust a phase and a gain of the third channel of signal that is divided by the second digital predistortion module and then output an adjusted signal to the second shaping unit. The second shaping unit is configured to perform a waveform adjustment on the signal that is obtained after the second phase and gain adjustment unit adjusts the phase and the gain and then output a signal obtained after the waveform adjustment to the first adder.

Optionally, the first adjustment module includes a first phase and gain adjustment unit and a first shaping unit, and the second adjustment module includes a second phase and gain adjustment unit and a second shaping unit;

the first phase and gain adjustment unit is configured to adjust a phase and a gain of the first channel of signal that is divided by the first digital predistortion module and then output an adjusted signal to the first shaping unit. The first shaping unit is configured to perform a waveform adjustment on the signal that is obtained after the first phase and gain adjustment unit adjusts the phase and the gain and then output a signal obtained after the waveform adjustment to the first adder. The second shaping unit is configured to perform a waveform adjustment on the third channel of signal that is divided by the second digital predistortion module and then output a signal obtained after the waveform adjustment to the second phase and gain adjustment unit. The second phase and gain adjustment unit is configured to adjust a phase and a gain of the signal that is obtained after the second shaping unit performs the waveform adjustment and then output an adjusted signal to the first adder.

Optionally, the first adjustment module includes a first phase and gain adjustment unit and a first shaping unit, and the second adjustment module includes a second phase and gain adjustment unit and a second shaping unit. The first shaping unit is configured to perform a waveform adjustment on the first channel of signal that is divided by the first digital predistortion module and then output a signal obtained after the waveform adjustment to the first phase and gain adjustment unit. The first phase and gain adjustment unit is configured to adjust a phase and a gain of the signal that is obtained after the first shaping unit performs the waveform adjustment and then output an adjusted signal to the first adder. The second shaping unit is configured to perform a waveform adjustment on the third channel of signal that is divided by the second digital predistortion module and then output a signal obtained after the waveform adjustment to the second phase and gain adjustment unit. The second phase and gain adjustment unit is configured to adjust a phase and a gain of the signal that is obtained after the second shaping unit performs the waveform adjustment and then output an adjusted signal to the first adder.

Optionally, the apparatus further includes a first delay adjustment module and a second delay adjustment module. The first delay adjustment module is connected to the first digital predistortion module and configured to adjust a time delay of the second channel of signal that is divided by the first digital predistortion module and then output a signal obtained after the delay adjustment to the second adder. The second delay adjustment module is connected to the second digital predistortion module and configured to adjust a time delay of the fourth channel of signal that is divided by the second digital predistortion module and then output a signal obtained after the delay adjustment to the second adder.

It can be learned from the foregoing embodiments of the present application that because there are two input terminals that receive signals in different frequency bands, a signal in each frequency band is processed by a corresponding function module, that is, the entire power amplification apparatus is designed according to a division of a frequency band. Therefore, compared with the prior art, according to the multiband power amplification apparatus provided in the embodiments of the present application, design performance of an inter-band power amplifier can be improved, efficiency can be enhanced, relatively high efficiency can be maintained when a single power amplifier is used in cases of an inter-band and a single frequency band, and types of power amplifiers can be reduced, which reduces costs of an equipment vendor and an operator.

BRIEF DESCRIPTION OF THE DRAWINGS

To describe the technical solutions in the embodiments of the present application more clearly, the following briefly introduces the accompanying drawings required for describing the prior art or the embodiments. Apparently, the accompanying drawings in the following description show merely some embodiments of the present application, and a person skilled in the art may still derive other drawings from these accompanying drawings.

FIG. 3a is a schematic structural diagram of a multiband power amplification apparatus according to another embodiment of the present application;

FIG. 3b is a schematic structural diagram of a multiband power amplification apparatus according to another embodiment of the present application;

FIG. 3c is a schematic structural diagram of a multiband power amplification apparatus according to another embodiment of the present application;

FIG. 3d is a schematic structural diagram of a multiband power amplification apparatus according to another embodiment of the present application;

FIG. 4a is a schematic structural diagram of a multiband power amplification apparatus according to another embodiment of the present application;

FIG. 4b is a schematic structural diagram of a multiband power amplification apparatus according to another embodiment of the present application;

FIG. 4c is a schematic structural diagram of a multiband power amplification apparatus according to another embodiment of the present application;

FIG. 4d is a schematic structural diagram of a multiband power amplification apparatus according to another embodiment of the present application; and FIG. 4e is a schematic structural diagram of a multiband power amplification apparatus according to another embodiment of the present application.

DETAILED DESCRIPTION OF ILLUSTRATIVE EMBODIMENTS

The following clearly describes the technical solutions in the embodiments of the present application with reference to the accompanying drawings in the embodiments of the present application. Apparently, the described embodiments are merely some but not all of the embodiments of the present application. All other embodiments obtained by a person skilled in the art based on the embodiments of the present application shall fall within the protection scope of the present application.

Figure 1:
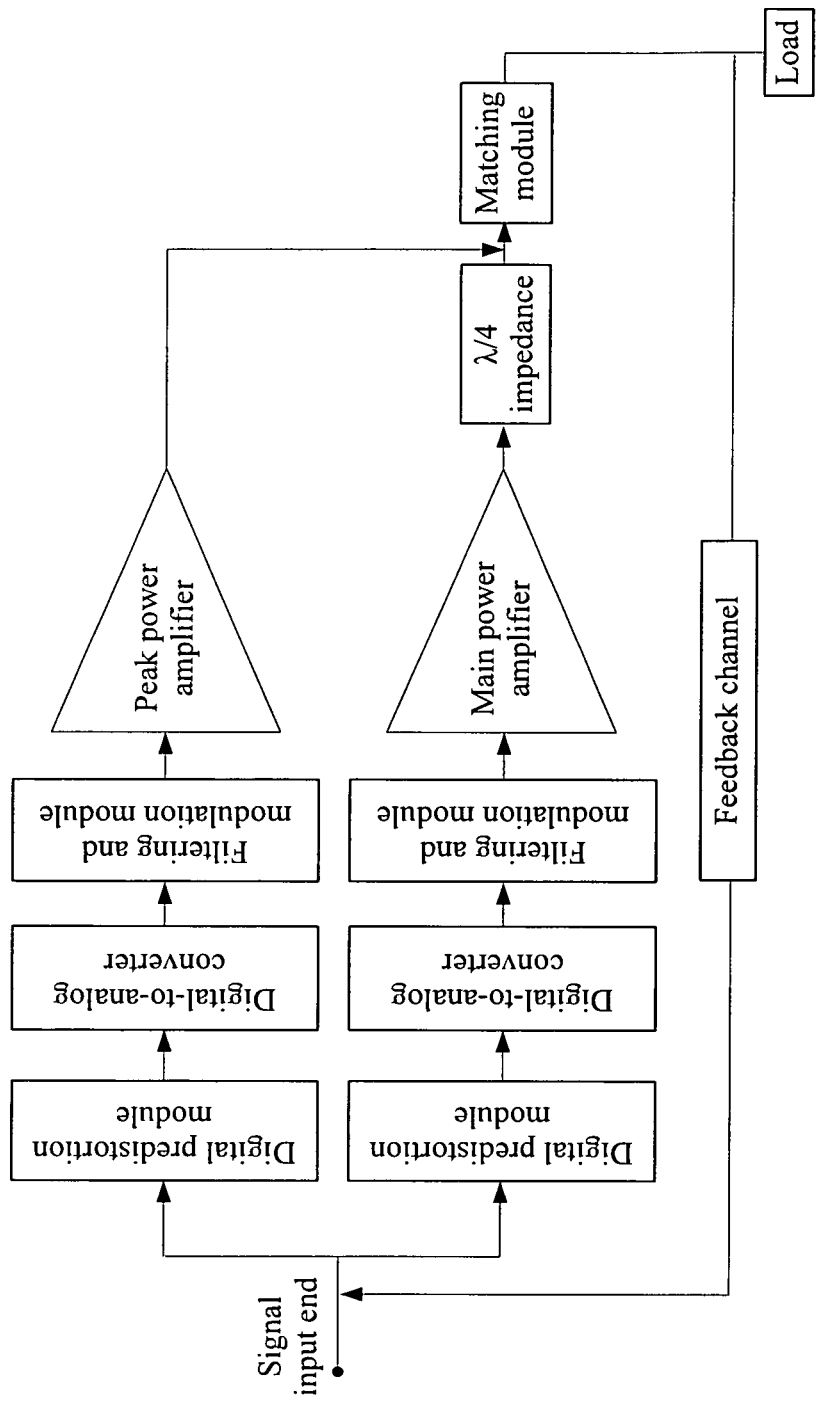
FIG. 1 is a schematic diagram of a dual-input Doherty architecture in the prior art.
Figure 2:
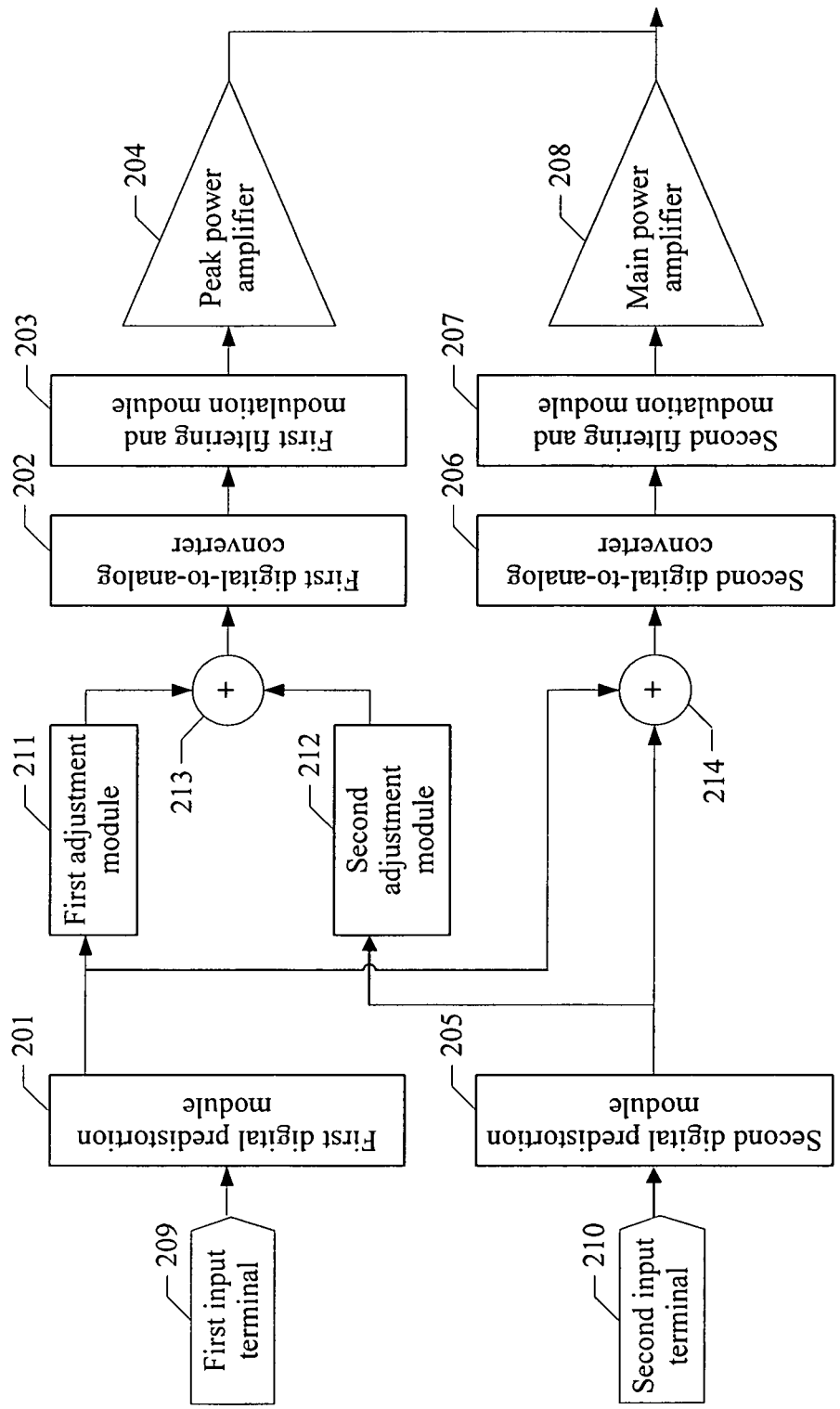
FIG. 2 is a schematic structural diagram of a multiband power amplification apparatus according to an embodiment of the present application.

FIG. 2 is a schematic structural diagram of a multiband power amplification apparatus according to an embodiment of the present application. The multiband power amplification apparatus shown in FIG. 2 mainly includes a first digital predistortion module 201, a first digital-to-analog converter 202, a first filtering and modulation module 203, a peak power amplifier 204 connected to the first filtering and modulation module 203, a second digital predistortion module 205, a second digital-to-analog converter 206, a second filtering and modulation module 207, and a main power amplifier 208 connected to the second filtering and modulation module 207. Different from a dual-input Doherty architecture that is provided in the prior art and shown in FIG. 1, the multiband power amplification apparatus shown in FIG. 2 further includes a first input terminal 209, a second input terminal 210, a first adjustment module 211, a first adder 213, a second adjustment module 212, and a second adder 214.

The first input terminal 209 is connected to the first digital predistortion module 201 and configured to receive a signal in a frequency band $f_1$ and then output the signal in the frequency band $f_1$ to the first digital predistortion module 201. In this embodiment of the present application, the first digital predistortion module 201 divides the signal in the frequency band $f_1$ into two channels of signals: a first channel of signal and a second channel of signal.

The second input terminal 210 is connected to the second digital predistortion module 205 and configured to receive a signal in a frequency band $f_2$ and then output the signal in the frequency band $f_2$ to the second digital predistortion module 205. In this embodiment of the present application, the second digital predistortion module 205 divides the signal in the frequency band $f_2$ into two channels of signals: a third channel of signal and a fourth channel of signal.

The first adjustment module 211 is connected to the first digital predistortion module 201 and configured to adjust the first channel of signal that is divided by the first digital predistortion module 201 and then output an adjusted first channel of signal to the first adder 213.

The second adjustment module 212 is connected to the second digital predistortion module 205 and configured to adjust the third channel of signal divided by the second digital predistortion module 205 and then output an adjusted third channel of signal to the first adder 213.

The first adder 213 is configured to converge the signal adjusted by the second adjustment module 212 and the signal output by the first adjustment module 211 and output a converged signal to the first digital-to-analog converter 202.

The second adder 214 is configured to converge the second channel of signal that is divided by the first digital predistortion module and the fourth channel of signal that is divided by the second digital predistortion module and output a converged signal to the second digital-to-analog converter 206.

The multiband power amplification apparatus provided in FIG. 2 as an example is designed according to a division of a frequency band. The first digital predistortion module 201 and the second digital predistortion module 205 perform digital predistortion (DPD) according to different frequency bands, that is, the frequency band of the signal received by the first input terminal 209 is $f_1$ and the frequency band of the signal received by the second input terminal 210 is $f_2$. Specifically, the multiband power amplification apparatus corrects nonlinearity of a power amplifier so that a signal output by the power amplifier meets a requirement of a protocol for linearity of a signal.

It should be noted that although the multiband power amplification apparatus provided in FIG. 2 as an example is designed according to the division of the frequency band, the multiband power amplification apparatus provided in FIG. 2 as an example may still be applicable to a signal at a single frequency band. For example, the first input terminal 209 receives only the signal in the frequency band $f_1$ and then outputs the signal in the frequency band $f_1$ to the first digital predistortion module 201, and the second input terminal 210 does not receive a signal in any one frequency band. In this case, it is equivalent that the first adjustment module 211 adjusts the first channel of signal that is divided by the first digital predistortion module 201 and then directly outputs the adjusted first channel of signal to the first digital-to-analog converter 202.

Alternatively, the second input terminal 210 receives only the signal in the frequency band $f_2$ and then output the signal in the frequency band $f_2$ to the second digital predistortion module 205, and the first input terminal 209 does not receive a signal in any one frequency band. In this case, it is equivalent that the second adjustment module 212 adjusts the first channel of signal that is divided by the second digital predistortion module 205 and then directly outputs the adjusted first channel of signal to the first digital-to-analog converter 202.

The first adjustment module 211 receives the first channel of signal that is divided by the first digital predistortion module 201, and the first adjustment module 211 is configured to adjust the first channel of signal. The second adjustment module 212 receives the third channel of signal that is divided by the second digital predistortion module 205, and the second adjustment module 212 is configured to adjust the third channel of signal.

After processing by the first adjustment module 211 or the second adjustment module 212, aspects such as a phase, a gain, and a waveform of an adjusted output signal are changed, for example, the gain of the signal is increased or decreased, the phase is aligned, and an amplitude of the signal is increased or reduced, where the increase or decrease of the gain of the signal helps improve the distributing of input power on the peak power amplifier 204 and the main power amplifier 208, and the increase or reduction of the amplitude of the signal helps the peak power amplifier 204 and the main power amplifier 208 quickly enter deep saturation.

The first digital-to-analog converter 202 performs digital conversion on a digital signal output by the first adder 213, and a converted signal is an analog signal, so that the first filtering and modulation module 203 performs filtering and modulation on the analog signal.

The second digital-to-analog converter 206 performs digital conversion on a digital signal output by the second adder 214, and a converted signal is an analog signal, so that the second filtering and modulation module 207 performs filtering and modulation on the analog signal.

The first filtering and modulation module 203 performs filtering and modulation on the analog signal output by the first digital-to-analog converter 202, and the second filtering and modulation module 207 performs filtering and modulation on the analog signal output by the second digital-to-analog converter 206. The peak power amplifier 204 is mainly responsible for amplifying a signal of a high peak-to-average ratio, for example, a signal whose peak-to-average ratio is greater than 6 dB, and the main power amplifier 208 is mainly responsible for amplifying a signal of a low peak-to-average ratio, for example, a signal whose peak-to-average ratio is less than 6 dB.

As for the multiband power amplification apparatus provided in FIG. 2 as an example, when only the first input terminal 209 has an input signal, the first digital predistortion module 201 performs digital predistortion (DPD) on the signal in the frequency band $f_1$ and then divides the signal in the frequency band $f_1$ into two channels of signals: the first channel of signal and the second channel of signal, where a relatively ideal signal is obtained after the first adjustment module 211 adjusts a phase, a gain, and a waveform of the first channel of signal and then is output to the first digital-to-analog converter 202 by the first adder 213.

The first digital-to-analog converter 202 converts a digital signal to an analog signal and outputs the analog signal to the first filtering and modulation module 203, and the first filtering and modulation module 203 performs filtering and modulation on the analog signal. The first filtering and modulation module 203 outputs a filtered and modulated first channel of analog signal to the peak power amplifier 204. The peak power amplifier 204 amplifies the channel of analog signal and then outputs an amplified channel of analog signal. The second channel of signal that is divided by the first digital predistortion module 201 is input to the second digital-to-analog converter 206 by the second adder 214.

The second digital-to-analog converter 206 converts a digital signal to an analog signal and outputs the analog signal to the second filtering and modulation module 207, and the second filtering and modulation module 207 performs filtering and modulation on the analog signal. The second filtering and modulation module 207 outputs a filtered and modulated second channel of analog signal to the main power amplifier 208. The main power amplifier 208 amplifies the channel of analog signal and then outputs an amplified channel of analog signal.

As for the multiband power amplification apparatus provided in FIG. 2 as an example, when only the second input terminal 210 has an input signal, the second digital predistortion module 205 performs DPD on the signal in the frequency band $f_2$ and divides the signal in the frequency band $f_2$ into two channels of signals: the third channel of signal and the fourth channel of signal, where a relatively ideal signal is obtained after the second adjustment module 212 adjusts a phase, a gain, and a waveform of the third channel of signal and then is output to the first digital-to-analog converter 202 by the first adder 213.

The first digital-to-analog converter 202 converts a digital signal to an analog signal and outputs the analog signal to the first filtering and modulation module 203, and the first filtering and modulation module 203 performs filtering and modulation on the analog signal. The first filtering and modulation module 203 outputs a filtered and modulated third channel of analog signal to the peak power amplifier 204. The peak power amplifier 204 amplifies the channel of analog signal and then outputs an amplified channel of analog signal. The fourth channel of signal that is divided by the second digital predistortion module 205 is input to the second digital-to-analog converter 206 by the second adder 214.

The second digital-to-analog converter 206 converts a digital signal to an analog signal and outputs the analog signal to the second filtering and modulation module 207, and the second filtering and modulation module 207 performs filtering and modulation on the analog signal. The second filtering and modulation module 207 outputs a filtered and modulated fourth channel of analog signal to the main power amplifier 208. The main power amplifier 208 amplifies the channel of analog signal and then outputs an amplified channel of analog signal.

It can be learned from the foregoing multiband power amplification apparatus provided in this embodiment of the present application that because there are two input terminals that receive signals at different frequency bands, a signal at each frequency band is processed by a corresponding function module, that is, the entire power amplification apparatus is designed according to a division of a frequency band. Therefore, compared with the prior art, according to the multiband power amplification apparatus provided in the embodiments of the present application, design performance of an inter-band power amplifier can be improved, efficiency can be enhanced, relatively high efficiency can be maintained when a single power amplifier is used in cases of an inter-band and a single frequency band, and types of power amplifiers can be reduced, which reduces costs of an equipment vendor and an operator.

FIG. 3a, FIG. 3b, FIG. 3c, and FIG. 3d respectively show schematic diagrams of a multiband power amplification apparatus according to an embodiment of the present application. The multiband power amplification apparatus shown in FIG. 3a, FIG. 3b, FIG. 3c, or FIG. 3d and the description of the figure may be based on FIG. 2 of an embodiment of the present application and the multiband power amplification apparatus shown in FIG. 2 in this embodiment of the present application.

In the multiband power amplification apparatus shown in any one of FIG. 3a, FIG. 3b, FIG. 3c, and FIG. 3d, a first adjustment module 211 may include a first phase and gain adjustment unit 301 and a first shaping unit 302, and a second adjustment module 212 includes a second phase and gain adjustment unit 303 and a second shaping unit 304. Because the first phase and gain adjustment unit 301 and the second phase and gain adjustment unit 303 are linear function units, and the first shaping unit 302 and the second shaping unit 304 are nonlinear function units, orders in which the first phase and gain adjustment unit 301 and the first shaping unit 302 process a signal input to the first adjustment unit 211 may be exchanged, and orders in which the second phase and gain adjustment unit 303 and the second shaping unit 304 process a signal input to the second adjustment module 212 may also be exchanged.

As for the multiband power amplification apparatus shown in FIG. 3a, the first phase and gain adjustment unit 301 is configured to adjust a phase and a gain of a first channel of signal that is divided by a first digital predistortion module 201 and then output an adjusted signal to the first shaping unit 302, and the first shaping unit 302 is configured to perform a waveform adjustment on the signal that is obtained after the first phase and gain adjustment unit 301 adjusts the phase and the gain and then output a signal obtained after the waveform adjustment to a first adder 213.

The second phase and gain adjustment unit 303 is configured to adjust a phase and a gain of a third channel of signal that is divided by a second digital predistortion module 205 and then output an adjusted signal to the second shaping unit 304, and the second shaping unit 304 is configured to perform a waveform adjustment on the signal that is obtained after the second phase and gain adjustment unit 303 adjusts the phase and the gain and then output a signal obtained after the waveform adjustment to the first adder 213.

It can be learned from the foregoing multiband power amplification apparatus shown in FIG. 3a that because the first shaping unit 302 performs the waveform adjustment on the signal that is obtained after the first phase and gain adjustment unit 301 adjusts the phase and the gain, for example, amplifying an amplitude of a large signal so that a peak power amplifier 204 quickly enters deep saturation, it is equivalent that the first adjustment module 211 interferes, in real time, in pulling when the multiband power amplification apparatus works in a frequency band $f_1$, so that the peak power amplifier 204 and a main power amplifier 208 maintain relatively high efficiency in both states of a large signal and a small signal. The first phase and gain adjustment unit 301 adjusts the gain and the phase of the signal input to the peak power amplifier 204, so that when the frequency band is $f_1$, a ratio of a gain of the peak power amplifier 204 in a dual-input amplifier to a gain of the main power amplifier 208 in the dual-input amplifier meets a requirement.

Likewise, because the second shaping unit 304 performs the waveform adjustment on the signal that is obtained after the second phase and gain adjustment unit 303 adjusts the phase and the gain, for example, compressing an amplitude of a small signal so that the main power amplifier 208 quickly enters deep saturation, it is equivalent that the second adjustment module 212 interferes, in real time, in pulling when the multiband power amplification apparatus works in a frequency band $f_2$, so that the peak power amplifier 204 and the main power amplifier 208 maintain relatively high efficiency in both states of a large signal and a small signal. The second phase and gain adjustment unit 303 adjusts a gain and a phase of a signal input to the peak power amplifier 204, so that when the frequency band is $f_2$, a ratio of a gain of the peak power amplifier 204 in the dual-input amplifier to a gain of the main power amplifier 208 in the dual-input amplifier meets the requirement.

As for the multiband power amplification apparatus shown in FIG. 3b, the first shaping unit 302 is configured to perform a waveform adjustment on the first channel of signal that is divided by the first digital predistortion module 201 and then output a signal obtained after the waveform adjustment to the first phase and gain adjustment unit 301, and the first phase and gain adjustment unit 301 is configured to adjust a phase and a gain of the signal that is obtained after the first shaping unit 301 performs the waveform adjustment and then output an adjusted signal to the first adder 213. The second phase and gain adjustment unit 303 is configured to adjust the phase and the gain of the third channel of signal that is divided by the second digital predistortion module 205 and then output an adjusted signal to the second shaping unit 304, and the second shaping unit 304 is configured to perform the waveform adjustment on the signal that is obtained after the second phase and gain adjustment unit 303 adjusts the phase and the gain and then output the signal obtained after the waveform adjustment to the first adder 213.

It can be learned from the foregoing multiband power amplification apparatus shown in FIG. 3b that because the first phase and gain adjustment unit 301 adjusts the gain and the phase of the signal input to the peak power amplifier 204, when the frequency band is $f_1$, a ratio of a gain of the peak power amplifier 204 in the dual-input amplifier to a gain of the main power amplifier 208 in the dual-input amplifier can meet the requirement. The first shaping unit 302 performs the waveform adjustment on the first channel of signal that is divided by the first digital predistortion module 201, for example, amplifying the amplitude of the large signal so that the peak power amplifier 204 can quickly enter the deep saturation, which is like that the first adjustment module 211 interferes, in real time, in pulling when the multiband power amplification apparatus works in a frequency band $f_1$, so that the peak power amplifier 204 and the main power amplifier 208 maintains relatively high efficiency in both states of a large signal and a small signal.

Likewise, because the second shaping unit 304 performs the waveform adjustment on the signal that is obtained after the second phase and gain adjustment unit 303 adjusts the phase and the gain, for example, compressing the amplitude of the small signal so that the main power amplifier 208 can quickly enter the deep saturation, it is equivalent that the second adjustment module 212 interferes, in real time, in pulling when the multiband power amplification apparatus works in a frequency band $f_2$, so that the peak power amplifier 204 and the main power amplifier 208 maintains the relatively high efficiency in both states of the large signal and the small signal. The second phase and gain adjustment unit 303 adjusts the gain and the phase of the signal input to the peak power amplifier 204, so that when the frequency band is $f_2$, the ratio of the gain of the peak power amplifier 204 in the dual-input amplifier to the gain of the main power amplifier 208 in the dual-input amplifier meets the requirement.

As for the multiband power amplification apparatus shown in FIG. 3c, the first phase and gain adjustment unit 301 is configured to adjust the phase and the gain of the first channel of signal that is divided by the first digital predistortion module 201 and then output the adjusted signal to the first shaping unit 302, and the first shaping unit 302 is configured to perform the waveform adjustment on the signal that is obtained after the first phase and gain adjustment unit 301 adjusts the phase and the gain and then output the signal obtained after the waveform adjustment to the first adder 213. The second shaping unit 304 is configured to perform a waveform adjustment on the third channel of signal that is divided by the second digital predistortion module 205 and then output a signal obtained after the waveform adjustment to the second phase and gain adjustment unit 303, and the second phase and gain adjustment unit 303 is configured to adjust a phase and a gain of the signal that is obtained after the second shaping unit 304 performs the waveform adjustment and then output an adjusted signal to the first adder 213.

It can be learned from the foregoing multiband power amplification apparatus shown in FIG. 3c that because the first shaping unit 302 performs the waveform adjustment on the signal that is obtained after the first phase and gain adjustment unit 301 adjusts the phase and the gain, for example, amplifying the amplitude of the large signal so that the peak power amplifier 204 can quickly enter the deep saturation, it is equivalent that the first adjustment module 211 interferes, in real time, in pulling when the multiband power amplification apparatus works in a frequency band $f_1$, so that the peak power amplifier 204 and the main power amplifier 208 maintains the relatively high efficiency in both states of the large signal and the small signal. The first phase and gain adjustment unit 301 adjusts the gain and the phase of the signal input to the peak power amplifier 204, so that when the frequency band is $f_1$, a ratio of a gain of the peak power amplifier 204 in the dual-input amplifier to a gain of the main power amplifier 208 in the dual-input amplifier can meet the requirement.

Likewise, because the second phase and gain adjustment unit 303 adjusts the gain and the phase of the signal input to the peak power amplifier 204, when the frequency band is $f_2$, a ratio of a gain of the peak power amplifier 204 in the dual-input amplifier to a gain of the main power amplifier 208 in the dual-input amplifier can meet the requirement. The second shaping unit 304 performs the waveform adjustment on the third channel of signal that is divided by the second digital predistortion module 205, for example, compressing the amplitude of the small signal so that the main power amplifier 208 can quickly enter the deep saturation, which is like that the second adjustment module 212 interferes, in real time, in pulling when the multiband power amplification apparatus works in a frequency band $f_2$, so that the peak power amplifier 204 and the main power amplifier 208 maintains the relatively high efficiency in both states of the large signal and the small signal.

As for the multiband power amplification apparatus shown in FIG. 3d, the first shaping unit 302 is configured to perform the waveform adjustment on the first channel of signal that is divided by the first digital predistortion module 201 and then output the signal obtained after the waveform adjustment to the first phase and gain adjustment unit 301, and the first phase and gain adjustment unit 301 is configured to adjust the phase and the gain of the signal that is obtained after the first shaping unit 302 performs the waveform adjustment and then output the adjusted signal to the first adder 213. The second shaping unit 304 is configured to perform the waveform adjustment on the third channel of signal that is divided by the second digital predistortion module 205 and then output the signal obtained after the waveform adjustment to the second phase and gain adjustment unit 303, and the second phase and gain adjustment unit 303 is configured to adjust the phase and the gain of the signal that is obtained after the second shaping unit 304 performs the waveform adjustment and then output the adjusted signal to the first adder 213.

It can be learned from the foregoing multiband power amplification apparatus shown in FIG. 3d that because the first phase and gain adjustment unit 301 adjusts the gain and the phase of the signal input to the peak power amplifier 204, when the frequency band is $f_1$, a ratio of a gain of the peak power amplifier 204 in the dual-input amplifier to a gain of the main power amplifier 208 in the dual-input amplifier can meet the requirement. The first shaping unit 302 performs the waveform adjustment on the first channel of signal that is divided by the first digital predistortion module 201, for example, amplifying the amplitude of the large signal so that the peak power amplifier 204 can quickly enter the deep saturation, which is like that the first adjustment module 211 interferes, in real time, in pulling when the multiband power amplification apparatus works in a frequency band $f_1$, so that the peak power amplifier 204 and the main power amplifier 208 maintains the relatively high efficiency in both states of the large signal and the small signal.

Likewise, because the second phase and gain adjustment unit 303 adjusts the gain and the phase of the signal input to the peak power amplifier 204, when the frequency band is $f_2$, a ratio of a gain of the peak power amplifier 204 in the dual-input amplifier to a gain of the main power amplifier 208 in the dual-input amplifier can meet the requirement. The second shaping unit 304 performs the waveform adjustment on the third channel of signal that is divided by the second digital predistortion module 205, for example, compressing the amplitude of the small signal so that the main power amplifier 208 quickly enters the deep saturation, which is like that the second adjustment module 212 interferes, in real time, in pulling when the multiband power amplification apparatus works in a frequency band $f_2$, so that the peak power amplifier 204 and the main power amplifier 208 maintains the relatively high efficiency in both states of the large signal and the small signal.

In the multiband power amplification apparatus shown in any one of the foregoing FIG. 3a, FIG. 3b, FIG. 3c, and FIG. 3d, a first phase and gain adjustment unit 301 adjusts a gain and a phase of a signal input to a peak power amplifier 204, for example, increasing or decreasing the gain of the signal, and aligning the phase, so that when the frequency band is $f_1$, a ratio of a gain of the peak power amplifier 204 in a dual-input amplifier to a gain of a main power amplifier 208 in the dual-input amplifier meets a requirement. A first shaping unit 302 performs a waveform adjustment on the signal that is obtained after the first phase and gain adjustment unit 301 adjusts the phase and the gain, for example, amplifying an amplitude of a large signal so that the peak power amplifier 204 quickly enters deep saturation, which is like that the first adjustment module 211 interferes, in real time, in pulling when the multiband power amplification apparatus works in a frequency band $f_1$, so that the peak power amplifier 204 and the main power amplifier 208 maintains relatively high efficiency in both states of a large signal and a small signal.

For example, if an input of the multiband power amplification apparatus is 50 dBm, it is equivalent that the first shaping unit 302 enables both the main power amplifier 208 and the peak power amplifier 204 to work in a saturation state. If an input of multiband power amplification apparatus is less than 44 dBm, the first shaping unit 302 enables the main power amplifier 208 to work in a saturation state while the peak power amplifier 204 does not bear the amplification of the signal as much as possible, so that high efficiency can be maintained.

Likewise, the second phase and gain adjustment unit 303 adjusts a gain and a phase of a signal input to the peak power amplifier 204, for example, increasing or decreasing the gain of the signal and aligning the phase, so that when the frequency band is $f_2$, a ratio of a gain of the peak power amplifier 204 in the dual-input amplifier to a gain of the main power amplifier 208 in the dual-input amplifier meets the requirement. The second shaping unit 304 performs a waveform adjustment on the signal that is obtained after the second phase and gain adjustment unit 303 adjusts the phase and the gain, for example, compressing an amplitude of a small signal so that the main power amplifier 208 quickly enters deep saturation, which is like that the second adjustment module 212 interferes, in real time, in pulling when the multiband power amplification apparatus works in a frequency band $f_2$, so that the peak power amplifier 204 and the main power amplifier 208 maintains relatively high efficiency in both states of the large signal and the small signal.

FIG. 4a, FIG. 4b, FIG. 4c, FIG. 4d, and FIG. 4e show schematic diagrams of a multiband power amplification apparatus according to an embodiment of the present application. The multiband power amplification apparatuses shown in FIG. 4a, FIG. 4b, FIG. 4c, FIG. 4d, FIG. 4e, and the descriptions of these figures may be based on FIG. 2, FIG. 3a, FIG. 3b, FIG. 3c, and FIG. 3d in the embodiments of the present application and the multiband power amplification apparatuses shown in FIG. 2, FIG. 3a, FIG. 3b, FIG. 3c, and FIG. 3d in the embodiments of the present application.

The multiband power amplification apparatus shown in FIG. 4a, FIG. 4b, FIG. 4c, FIG. 4d, or FIG. 4e may further includes a first delay adjustment module 401 connected to a first digital predistortion module 201 and a second delay adjustment module 402 connected to a second digital predistortion module 205.

The first delay adjustment module 401 is configured to adjust a time delay of a signal that is in a second channel and divided by the first digital predistortion module 201, and a signal obtained after the delay adjustment and a signal adjusted by the second delay adjustment module 402 are converged and then are output to a second digital-to-analog converter 206.

The second delay adjustment module 402 is configured to adjust a time delay of a signal that is in a fourth channel and divided by the second digital predistortion module 205, and a signal obtained after the delay adjustment and the signal adjusted by the first delay adjustment module 401 are converged and then are output to the second digital-to-analog converter 206.

It can be learned from the multiband power amplification apparatus shown in FIG. 4a, FIG. 4b, FIG. 4c, FIG. 4d, or FIG. 4e that because a first adjustment module 211 and the first delay adjustment module 401 work together, and a second adjustment module 212 and the second delay adjustment module 402 work together, when a frequency band is $f_1$, a ratio of a gain of a peak power amplifier 204 in a dual-input amplifier to a gain of a main power amplifier 208 in the dual-input amplifier can meet a requirement. A second adjustment module 212 and the second delay adjustment module 402 work together, so that when a frequency band is $f_2$, a ratio of a gain of the peak power amplifier 204 in the dual-input amplifier and a gain of the main power amplifier 208 in the dual-input amplifier can meet the requirement.

The first delay adjustment module 401 adjusts the time delay of the second channel of signal that is divided by the first digital predistortion module 201, and the second delay adjustment module 402 adjusts the time delay of the fourth channel of signal that is divided by the second digital predistortion module 205, so that the phase and time delay of the second channel of signal and these of the fourth channel of signal meets a requirement of a Doherty power amplifier for pulling and efficiency of the power amplifier reaches an ideal state.

When an operator uses the multiband power amplification apparatus shown in the foregoing FIG. 2 to FIG. 4e at most of time, there is usually only one frequency band. Superficially, because of this inter-band and ultra-wideband design, efficiency sacrificed for using the multiband power amplification apparatus in a signal frequency band is very high, which increases costs of the operator. However, when the multiband power amplification apparatus is being used, the operator may close the second digital predistortion module 205, the second adjustment module 212 (or a second phase and gain adjustment unit 303 and a second shaping unit 304), and the second delay adjustment module 402, and use only the first digital predistortion module 201, the first adjustment module 211 (or a first phase and gain adjustment unit 301 and a first shaping unit 302), and the first delay adjustment module 401; or the operator may close the first digital predistortion module 201, the first adjustment module 211 (or the first phase and gain adjustment unit 301 and the first shaping unit 302), and the first delay adjustment module 401, and use only the second digital predistortion module 205, the second adjustment module 212 (or the second phase and gain adjustment unit 303 and the second shaping unit 304), and the second delay adjustment module 402, so that a feature of working at a single frequency band by the power amplifier can be significantly improved, which offsets efficiency that is sacrificed when the power amplifier is designed to be inter-band.

In another aspect, the multiband power amplification apparatus provided in this embodiment of the present application includes a first digital predistortion module, a first digital-to-analog converter, a first filtering and modulation module, a peak power amplifier connected to the first filtering and modulation module, a second digital predistortion module, a second digital-to-analog converter, a second filtering and modulation module connected to the second digital-to-analog converter, and a main power amplifier connected to the second filtering and modulation module, where the apparatus further includes a first input terminal, a second input terminal, a first adjustment module, a second adjustment module, a first adder, and a second adder.

The first input terminal is connected to the first digital predistortion module and configured to receive a signal in a frequency band $f_1$ and then output the signal in the frequency band $f_1$ to the first digital predistortion module, where the first digital predistortion module divides the signal in the frequency band $f_1$ into a first channel of signal and a second channel of signal.

The second input terminal is connected to the second digital predistortion module and configured to receive a signal in a frequency band $f_2$ and then output the signal in the frequency band $f_2$ to the second digital predistortion module, where the second digital predistortion module divides the signal in the frequency band $f_2$ into a third channel of signal and a fourth channel of signal. The first adjustment module is connected to the first digital predistortion module and configured to adjust the first channel of signal that is divided by the first digital predistortion module and then output an adjusted first channel of signal to the first adder.

The second adjustment module is connected to the second digital predistortion module and configured to adjust the third channel of signal that is divided by the second digital predistortion module and then output an adjusted third channel of signal to the first adder.

The first adder is configured to converge the signal adjusted by the second adjustment module and the signal output by the first adjustment module and output a converged signal to the first digital-to-analog converter.

The second adder is configured to converge the second channel of signal that is divided by the first digital predistortion module and the fourth channel of signal that is divided by the second digital predistortion module and output a converged signal to the second digital-to-analog converter.

It is assumed that the foregoing is a first possible implementation manner. In a second possible implementation manner that is provided on a basis of the first possible implementation manner, the first adjustment module includes a first phase and gain adjustment unit and a first shaping unit, and the second adjustment module includes a second phase and gain adjustment unit and a second shaping unit.

The first phase and gain adjustment unit is configured to adjust a phase and a gain of the first channel of signal that is divided by the first digital predistortion module and then output an adjusted signal to the first shaping unit.

The first shaping unit is configured to perform a waveform adjustment on the signal that is obtained after the first phase and gain adjustment unit adjusts the phase and the gain and then output a signal obtained after the waveform adjustment to the first adder.

The second phase and gain adjustment unit is configured to adjust a phase and a gain of the third channel of signal that is divided by the second digital predistortion module and then output an adjusted signal to the second shaping unit.

The second shaping unit is configured to perform a waveform adjustment on the signal that is obtained after the second phase and gain adjustment unit adjusts the phase and the gain and then output a signal obtained after the waveform adjustment to the first adder.

It is assumed that the foregoing is a first possible implementation manner. In a third possible implementation manner that is provided on a basis of the first possible implementation manner, the first adjustment module includes a first phase and gain adjustment unit and a first shaping unit, and the second adjustment module includes a second phase and gain adjustment unit and a second shaping unit.

The first shaping unit is configured to perform a waveform adjustment on the first channel of signal that is divided by the first digital predistortion module and then output a signal obtained after the waveform adjustment to the first phase and gain adjustment unit.

The first phase and gain adjustment unit is configured to adjust a phase and a gain of the signal that is obtained after the first shaping unit performs the waveform adjustment and then output an adjusted signal to the first adder.

The second phase and gain adjustment unit is configured to adjust a phase and a gain of the third channel of signal that is divided by the second digital predistortion module and then output an adjusted signal to the second shaping unit.

The second shaping unit is configured to perform a waveform adjustment on the signal that is obtained after the second phase and gain adjustment unit adjusts the phase and the gain and then output a signal obtained after the waveform adjustment to the first adder.

It is assumed that the foregoing is a first possible implementation manner. In a fourth possible implementation manner that is provided on a basis of the first possible implementation manner, the first adjustment module includes a first phase and gain adjustment unit and a first shaping unit, and the second adjustment module includes a second phase and gain adjustment unit and a second shaping unit.

The first phase and gain adjustment unit is configured to adjust a phase and a gain of the first channel of signal that is divided by the first digital predistortion module and then output an adjusted signal to the first shaping unit.

The first shaping unit is configured to perform a waveform adjustment on the signal that is obtained after the first phase and gain adjustment unit adjusts the phase and the gain and then output a signal obtained after the waveform adjustment to the first adder.

The second shaping unit is configured to perform a waveform adjustment on the third channel of signal that is divided by the second digital predistortion module and then output a signal obtained after the waveform adjustment to the second phase and gain adjustment unit.

The second phase and gain adjustment unit is configured to adjust a phase and a gain of the signal that is obtained after the second shaping unit performs the waveform adjustment and then output an adjusted signal to the first adder.

It is assumed that the foregoing is a first possible implementation manner. In a fifth possible implementation manner that is provided on a basis of the first possible implementation manner, the first adjustment module includes a first phase and gain adjustment unit and a first shaping unit, and the second adjustment module includes a second phase and gain adjustment unit and a second shaping unit.

The first shaping unit is configured to perform a waveform adjustment on the first channel of signal that is divided by the first digital predistortion module and then output a signal obtained after the waveform adjustment to the first phase and gain adjustment unit.

The first phase and gain adjustment unit is configured to adjust a phase and a gain of the signal that is obtained after the first shaping unit performs the waveform adjustment and then output an adjusted signal to the first adder.

The second shaping unit is configured to perform a waveform adjustment on the third channel of signal that is divided by the second digital predistortion module and then output a signal obtained after the waveform adjustment to the second phase and gain adjustment unit.

The second phase and gain adjustment unit is configured to adjust a phase and a gain of the signal that is obtained after the second shaping unit performs the waveform adjustment and then output an adjusted signal to the first adder.

In a sixth possible implementation manner that is provided on a basis of the first, the second, the third, the fourth, or the fifth possible implementation manner, the apparatus further includes a first delay adjustment module and a second delay adjustment module.

The first delay adjustment module is connected to the first digital predistortion module and configured to adjust a time delay of the second channel of signal that is divided by the first digital predistortion module and then output a signal obtained after the delay adjustment to the second adder.

The second delay adjustment module is connected to the second digital predistortion module and configured to adjust a time delay of the fourth channel of signal that is divided by the second digital predistortion module and then output a signal obtained after the delay adjustment to the second adder.

The foregoing provides a detailed description of a multiband power amplification apparatus according to the embodiments of the present application, where specific examples are used in this specification to illustrate a principle and implementation manners of the present application. Descriptions of the foregoing embodiments are merely intended to help understand a method and a core idea of the present application. In addition, for a person skilled in the art, on a basis of the idea of the present application, a modification may be made to a specific implementation manner and an application scope. In conclusion, content of this specification shall not be understood as a limitation to the present application.

In the several embodiments provided in the present application, it should be understood that the disclosed system, apparatus, and method may be implemented in other manners. For example, the described apparatus embodiment is merely exemplary. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected according to actual needs to achieve the objectives of the solutions of the embodiments.

In addition, functional units in the embodiments of the present application may be integrated into one processing unit, or each of the units may exist alone physically, or two or more units are integrated into one unit.

When the functions are implemented in the form of a software functional unit and sold or used as an independent product, the functions may be stored in a computer-readable storage medium. Based on such an understanding, the technical solutions of the present application essentially, or the part contributing to the prior art, or some of the technical solutions may be implemented in a form of a software product. The software product is stored in a storage medium, and includes several instructions for instructing a computer device (which may be a personal computer, a server, or a network device) to perform all or some of the steps of the methods described in the embodiments of the present application. The foregoing storage medium includes: any medium that can store program code, such as a USB flash drive, a removable hard disk, a read-only memory (ROM), a random access memory (RAM), a magnetic disk, or an optical disc.

The foregoing descriptions are merely specific implementation manners of the present application, but are not intended to limit the protection scope of the present application. Any variation or replacement readily figured out by a person skilled in the art within the technical scope disclosed in the present application shall fall within the protection scope of the present application. Therefore, the protection scope of the present application shall be subject to the protection scope of the claims.

What is claimed is:

1. A multiband power amplification apparatus, comprising:
    a first digital predistortion module;
    a first digital-to-analog converter;
    a first filtering and modulation module connected to the first digital-to-analog converter;
    a peak power amplifier connected to the first filtering and modulation module;
    a second digital predistortion module;
    a second digital-to-analog converter;
    a second filtering and modulation module connected to the second digital-to-analog converter;
    a main power amplifier connected to the second filtering and modulation module;
    a first input terminal, configured to receive a signal in a frequency band $f_1$ and output the signal in the frequency band $f_1$ to the first digital predistortion module, the first digital predistortion module configured to divide the signal in the frequency band $f_1$ into a first channel of signal and a second channel of signal;
    a second input terminal configured to receive a signal in a frequency band $f_2$ and output the signal in the frequency band $f_2$ to the second digital predistortion module, wherein the second digital predistortion module divides the signal in the frequency band $f_2$ into a third channel of signal and a fourth channel of signal;
    a first adder;
    a first adjustment module, configured to adjust the first channel of signal and output an adjusted first channel of signal to the first adder;
    a second adjustment module, configured to adjust the third channel of signal and output an adjusted third channel of signal to the first adder, wherein the first adder is configured to converge the signal adjusted by the second adjustment module and the signal output by the first adjustment module and output a converged signal to the first digital-to-analog converter; and
    a second adder, configured to converge the second channel of signal and the fourth channel of signal and output a converged signal to the second digital-to-analog converter.

2. The apparatus according to claim 1, wherein the first adjustment module comprises a first phase and gain adjustment unit and a first shaping unit, and the second adjustment module comprises a second phase and gain adjustment unit and a second shaping unit;
    wherein the first phase and gain adjustment unit is configured to adjust a phase and a gain of the first channel of signal and output an adjusted signal to the first shaping unit;
    wherein the first shaping unit is configured to perform a waveform adjustment on the signal that is obtained after the first phase and gain adjustment unit adjusts the phase and the gain and output a signal obtained after the waveform adjustment to the first adder;
    wherein the second phase and gain adjustment unit is configured to adjust a phase and a gain of the third channel of signal and output an adjusted signal to the second shaping unit; and
    wherein the second shaping unit is configured to perform a waveform adjustment on the signal that is obtained after the second phase and gain adjustment unit adjusts the phase and the gain and output a signal obtained after the waveform adjustment to the first adder.

3. The apparatus according to claim 1, wherein the first adjustment module comprises a first phase and gain adjustment unit and a first shaping unit, and the second adjustment module comprises a second phase and gain adjustment unit and a second shaping unit;
    wherein the first shaping unit is configured to perform a waveform adjustment on the first channel of signal and output a signal obtained after the waveform adjustment to the first phase and gain adjustment unit;
    wherein the first phase and gain adjustment unit is configured to adjust a phase and a gain of the signal that is obtained after the first shaping unit performs the waveform adjustment and output an adjusted signal to the first adder;
    wherein the second phase and gain adjustment unit is configured to adjust a phase and a gain of the third channel of signal and output an adjusted signal to the second shaping unit; and
    wherein the second shaping unit is configured to perform a waveform adjustment on the signal that is obtained after the second phase and gain adjustment unit adjusts the phase and the gain and output a signal obtained after the waveform adjustment to the first adder.

4. The apparatus according to claim 1, wherein the first adjustment module comprises a first phase and gain adjustment unit and a first shaping unit, and the second adjustment module comprises a second phase and gain adjustment unit and a second shaping unit;

wherein the first phase and gain adjustment unit is configured to adjust a phase and a gain of the first channel of signal and output an adjusted signal to the first shaping unit;

wherein the first shaping unit is configured to perform a waveform adjustment on the signal that is obtained after the first phase and gain adjustment unit adjusts the phase and the gain and output a signal obtained after the waveform adjustment to the first adder;

wherein the second shaping unit is configured to perform a waveform adjustment on the third channel of signal and output a signal obtained after the waveform adjustment to the second phase and gain adjustment unit; and wherein the second phase and gain adjustment unit is configured to adjust a phase and a gain of the signal that is obtained after the second shaping unit performs the waveform adjustment and output an adjusted signal to the first adder.

5. The apparatus according to claim 1, wherein the first adjustment module comprises a first phase and gain adjustment unit and a first shaping unit, and the second adjustment module comprises a second phase and gain adjustment unit and a second shaping unit;

wherein the first shaping unit is configured to perform a waveform adjustment on the first channel of signal and output a signal obtained after the waveform adjustment to the first phase and gain adjustment unit;

wherein the first phase and gain adjustment unit is configured to adjust a phase and a gain of the signal that is obtained after the first shaping unit performs the waveform adjustment and output an adjusted signal to the first adder;

wherein the second shaping unit is configured to perform a waveform adjustment on the third channel of signal and output a signal obtained after the waveform adjustment to the second phase and gain adjustment unit; and wherein the second phase and gain adjustment unit is configured to adjust a phase and a gain of the signal that is obtained after the second shaping unit performs the waveform adjustment and output an adjusted signal to the first adder.

6. The apparatus according to claim 1, further comprising a first delay adjustment module and a second delay adjustment module;

wherein the first delay adjustment module is connected to the first digital predistortion module and configured to adjust a time delay of the second channel of signal and output a signal obtained after the delay adjustment to the second adder; and wherein the second delay adjustment module is connected to the second digital predistortion module and configured to adjust a time delay of the fourth channel of signal and output a signal obtained after the delay adjustment to the second adder.

* * * * *